(12) United States Patent
Rijavec

(10) Patent No.: US 7,262,719 B2
(45) Date of Patent: Aug. 28, 2007

(54) FAST DATA STREAM DECODING USING APRIORI INFORMATION

(75) Inventor: Nenad Rijavec, Longmont, CO (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 11/342,728

(22) Filed: Jan. 30, 2006

(65) Prior Publication Data

US 2007/0176800 A1   Aug. 2, 2007

(51) Int. Cl.
*H03M 7/40* (2006.01)
(52) U.S. Cl. .................. 341/65; 341/67; 375/240.12; 375/240.23; 382/244; 382/245; 382/246
(58) Field of Classification Search .............. 341/65, 341/67
See application file for complete search history.

(56) References Cited

U.S. PATENT DOCUMENTS

| | | | |
|---|---|---|---|
| 5,408,425 A | 4/1995 | Hou | |
| 5,426,673 A | 6/1995 | Mitra et al. | |
| 5,649,077 A | 7/1997 | On et al. | |
| 5,822,003 A | 10/1998 | Girod et al. | |
| 6,009,207 A | 12/1999 | Chen | |
| 6,160,920 A | 12/2000 | Shyu | |
| 6,259,734 B1* | 7/2001 | Boon | 375/240 |
| 6,314,208 B1 | 11/2001 | Konstantinides et al. | |
| 6,332,030 B1 | 12/2001 | Manjunath et al. | |
| 6,346,947 B1 | 2/2002 | Kang et al. | |
| 6,529,551 B1 | 3/2003 | Yu et al. | |
| 6,597,815 B1 | 7/2003 | Satoh et al. | |
| 6,633,678 B2* | 10/2003 | Boon | 382/238 |
| 7,003,165 B2* | 2/2006 | Kuroda et al. | 382/233 |
| 2003/0187662 A1 | 10/2003 | Wilson | |
| 2006/0087585 A1* | 4/2006 | Seo et al. | 348/385.1 |
| 2006/0171460 A1* | 8/2006 | Masuda et al. | 375/240.03 |

FOREIGN PATENT DOCUMENTS

JP   8307862   4/1996

OTHER PUBLICATIONS

P. Dang et al.; *BinDCT and its Efficient VLSI Architecture for Real-Time Embedded Applications*; Journal of Imaging Science and Technology; vol. 49, No. 2, Mar./Apr. 2005 pp. 124-137.
G. Wallace; *The JPEG Still Picture Compression Standard*; Communications of the ACM; vol. 34, No. 4; Apr. 1991 pp. 31-44.

* cited by examiner

*Primary Examiner*—Khai Nguyen
(74) *Attorney, Agent, or Firm*—Duft Bornsen & Fishman, LLP

(57) ABSTRACT

Methods and systems for improving performance of data decoding using apriori information about the data steam. In one aspect a decoder may determine the degree of lossiness inherent in the data or in the application of the data as a maximum resolution of data to be decoded and may thereby streamline entropy decoding of the data. For example, in DCT-based image data compression coupled with Huffman or other entropy encoding, apriori data may be analyzed to determine the maximum required resolution in bits of the DCT encoded data so as to simplify the entropy decoding. Other aspects optimize DCT decoding computation with faster approximations where the quantization values indicate a higher degree of lossiness or noise in the DCT encoded data. Apriori information may generally comprise values in the quantization table of a DCT encoded image and may be analyzed to determine the maximum symbol size and/or degree of lossiness.

20 Claims, 8 Drawing Sheets

FAST DATA STREAM DECODING USING APRIORI INFORMATION

BACKGROUND OF THE INVENTION

1. Field of the Invention

The invention relates to the field of decoding data and in particular, to methods and systems for generating improved speed of lossy data compression decoding such as for image data.

2. Statement of the Problem

In a variety of computing and communication applications, data is encoded and decoded by cooperating elements of a processing or communication system. In computing applications, data may be compressed or encoded for storage and decompressed or decoded for utilization. For example, backup storage of a system may be so compressed (encoded) when stored for archival purposes and decompressed (decoded) when retrieved to restore lost data. Or, for example, image data may be compressed to reduce its required storage space and may be decompressed when presented on a display or document. Similarly, in communication applications, data may be encoded for compression by the transmitter and decompressed by decoding within a receiver.

One common application for such encoding and decoding of data is in digital imaging applications. A digital image may be encoded in a manner that compresses an otherwise significant volume of data for storage and then allows for decoding and decompression when the image is to be presented for further use. The encoding and decoding of images or other data for compression and decompression may also be utilized in communication applications of digital data. The transmitter may encode the image to compress the data and the receiver may utilize corresponding decode capabilities to decompress the data and present it to a user. For example, a computer system may encode (compress) digital image data to be transmitted from the computer system. A printing system may receive the compressed image data and decode (decompress) the received data for presentation on a printed page. Or, for example, a digital image may be encoded for transmission to a personal digital device such as a cell phone or a PDA for display on the LCD screen of the device. The personal digital device would then decode (decompress) the image and display it.

A significant number of digital imaging standards and other data compression/decompression standards have evolved for such applications. For example, JPEG, JPEG 2000, and MPEG are all image encoding/decoding standards that permit significant compression of digital image data. These and other standards include a variety of compression techniques that assure complete fidelity in reproduction of the original image as well as higher levels of compression that do not assure such fidelity in reproducing the original image. Compression techniques that assure such fidelity are often referred to as "lossless" compression whereas compression techniques that do not assure fidelity of the reproduced data are often referred to as "lossy" compression. Because exact reproduction of the original data is not required in a lossy compression scheme, lossy compression typically offers significant improvements in the amount of compression achieved by the encoding/decoding technique. Further, lossy compression techniques may run faster than lossless compression techniques because fidelity in reproduction of the original image is not a requirement.

In a number of such image compression/decompression applications, lossy compression techniques are preferred for their speed and improved compression ratio. For example, some digital images may include more detail than the human eye can recognize and hence lossy compression may produce a decompressed image that is good enough for such an application. Therefore, lossy compression techniques tend to be used where detail of an original image may be lost without defeating the intended purpose of the image transmission and presentation. Further, lossy compression is often used where speed is critical in the compression and decompression processing. Where a device compressing the data and/or decompressing the data has limited processing capability, slow encoding or decoding requiring significant processing capability may be unacceptable.

A number of encoding/decoding standards include features to shift the digital image data into a frequency domain or other domain and then to apply further mathematical techniques to compress the data as shifted into the new domain. For example, JPEG standards include utilization of a discrete cosine transform ("DCT") image encoding technique coupled with entropy encoding techniques such as Huffman coding of information. The DCT encoding techniques transform the original image data into a frequency domain approximating the image data. Though the transformation into the frequency domain, per se, may not compress the digital image data, it may reveal high frequency changes in the data that may be eliminated as "noise" by further computational transform techniques. Such "noise" may be deemed imperceptible by the human eye or other applications of the data and could thus be eliminated as unimportant. Such elimination of unimportant "noise" may permit significant compression of digital image data. The step of eliminating such noise is often referred to as quantization and represents a scaling of the data such that when restored the noise may be eliminated.

Noise signals so eliminated may be scaled or quantized to zeros in the data as transformed to the frequency domain. Thus, a subsequent step to encode the data as transformed to the frequency domain may compact or compress the encoding of the zero values in the transformed data. This compact encoding of the significant number of zero values in the transformed data allows significant compression of the original data stream.

The computational techniques that perform the requisite mathematics for the transform and quantization are inherently approximations of the actual real number mathematics. These techniques, in particular the quantization step of such a process, essentially discard unimportant data by discarding higher frequency changes in the data that are generally imperceptible in most applications utilizing the digital image. This minimal loss incurred by such DCT or other domain transform encoding techniques, though technically lossy by nature, can render images extremely close to the original digital image.

DCT and other such domain transform encoding techniques (such as wavelets utilized by JPEG 2000) tend to be compute intensive requiring significant mathematical processing power to encode or decode the image data with minimal loss of fidelity. In many practical applications of DCT encoding, the decoder (and sometimes the encoder) impose further loss of fidelity through mathematical shortcuts to speed up the computation process. For example, floating point real number arithmetic (already an approximation of real number arithmetic) may be replaced by faster integer approximation arithmetic. Or, for example, where a particular portion of the approximated image is relatively unchanged, "fastpath" techniques may detect such simple portions of data and dramatically reduce all computation, both floating point or integer approximations thereof. For example, a test may determine that pixels in a particular portion of an image are all the same. The processing for encoding or decoding such a portion may be dramatically reduced by detecting such a condition.

Though such fastpath optimizations are common and may provide significant speed enhancements for certain identified types of data, the more general path of decoding logic is more complicated because of the added testing required to identify the particular fastpath that may be optimized. Typically, such fastpath optimizations are identified for each of several portions of the compressed image. Thus, processing for more general decoding logic paths may be significantly impacted by the added overhead.

In particular, in the DCT encoding standards used in JPEG, a digital image is broken into two dimensional blocks of eight by eight blocks of picture elements. Fastpath techniques are therefore generally applicable to each such block of encoded data. There may be hundreds if not thousands or millions of such blocks in a larger image. The testing for identifying such path fastpath optimizations may therefore impose a significant overhead processing burden on the more general logic cases and paths utilized for many, if not the majority of, other encoded blocks of image where fastpath optimizations may not be applied.

None the less, fastpath improvements address computational overhead associated with DCT algorithm encoding or decoding of individual blocks of the image and are very effective in this regard. The entropy encoding (e.g. Huffman encoding) coupled with the DCT encoding in accordance with the various imaging standards is not generally affected by such fastpath optimizations. As improvements continue to accrue in DCT computational approximations and fastpath optimizations for the DCT encoding, the computational burden associated with the entropy encoding has risen to a larger portion of the total overhead for such image encoding and decoding.

It therefore remains an ongoing problem to further enhance data stream decoding, and in particular image data decoding, in such a manner as to benefit the general logic path for decoding regardless of the number of fastpath optimizations that may be identified for particular DCT encoded blocks of data.

SUMMARY OF THE SOLUTION

The invention solves the above and other related problems with methods and associated systems and apparatus operable to improve data decode performance for decoding standards by using apriori information derived from the data prior to performing decoding.

One aspect hereof provides a method for decoding a data stream having an entropy encoded sequence of encoded symbols. The method includes analyzing an aspect of the data stream to determine apriori information indicative of symbols not present in the compressed data stream. The method further includes entropy decoding the data stream in accordance with the apriori information by processing a portion of symbols present in the data stream devoid of processing for symbols not present in the data stream as indicated by the apriori information.

Another aspect hereof provides a method for decoding a data stream. The method includes analyzing an aspect of the data stream to determine apriori information indicative of an acceptable degree of lossiness in the data stream. The method further includes decoding the data stream in accordance with the apriori information by processing a portion of the data stream using mathematical approximations with a higher degree of lossiness as indicated by the apriori information.

Another aspect hereof provides a decoder for decoding an entropy encoded data stream. The decoder includes a data stream analyzer adapted to analyze information received in the data stream to determine apriori information indicating symbols not contained in the data stream. The decoder further includes an entropy decoder coupled to receive the apriori information and adapted to decode a sequence of entropy encoded symbols in the data stream in accordance with the apriori information to decode a portion of the symbols devoid of processing for entropy encoded symbols not present in the data stream as determined from the apriori information.

Yet another aspect hereof provides a decoder for decoding a data stream. The decoder includes a data analyzer adapted to analyze an aspect of the data stream to determine apriori information indicative of an acceptable degree of lossiness of the data stream. The decoder further includes a decoder configurable to decode the data stream in accordance with the apriori information by processing a portion of the data stream using arithmetic approximations with a higher degree of lossiness as indicated by the apriori information.

The invention may include other exemplary embodiments described below.

DESCRIPTION OF THE DRAWINGS

The same reference number represents the same element on all drawings.

DETAILED DESCRIPTION OF THE INVENTION

FIGS. 2–9 and the following description depict specific exemplary embodiments of the present invention to teach those skilled in the art how to make and use the invention. For the purpose of this teaching, some conventional aspects of the invention have been simplified or omitted. Those skilled in the art will appreciate variations from these embodiments that fall within the scope of the present invention. Those skilled in the art will appreciate that the features described below can be combined in various ways to form multiple variations of the present invention. As a result, the invention is not limited to the specific embodiments described below, but only by the claims and their equivalents.

Figure 1:
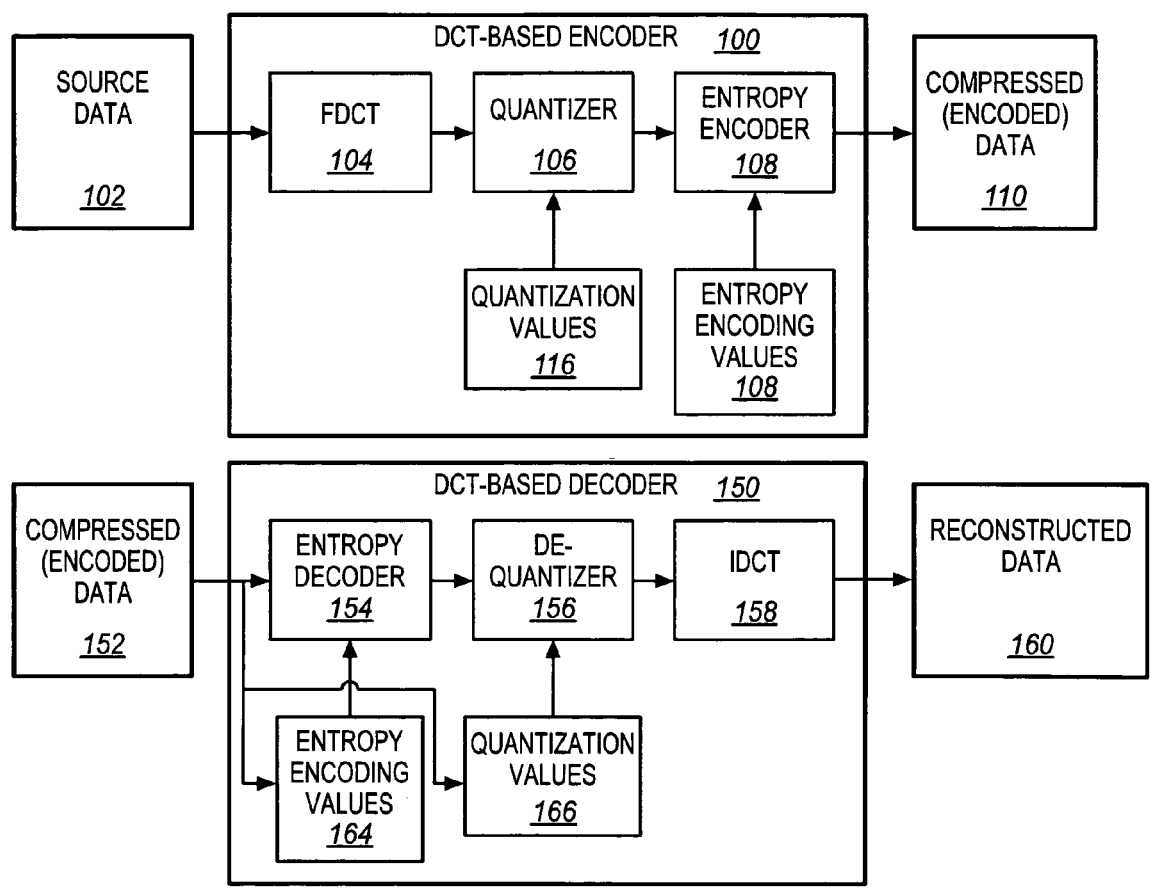
FIG. 1 is a block diagram of DCT-based encoder/decoder as presently practiced in the art such as for JPEG and other image data encoding applications.

FIG. 1 is a block diagram of a typical DCT-based encoder and decoder as generally utilized in image data compression and decompression. DCT-based encoder 100 and DCT-based decoder 150 both of FIG. 1 are typical of structures utilized in accordance with the JPEG standards for compression and decompression of image data. A similar structure is also generally utilized in JPEG 2000, MPEG, and other data encoding and decoding standards though other domain transform computations may be utilized in place of DCT encoding and decoding.

In general, DCT-based encoder 100 receives source data 102 and performs a mathematical discrete cosine transform (a forward DCT or FDCT) by processing of element 104. Forward DCT 104 produces a set of coefficients representative of a portion of the input source image transformed into a frequency domain. In particular, as is generally known in the art, the output of DCT 104 is a sequence of coefficients representing the weighting of a plurality of DCT two dimensional basis functions. The mathematical combination of the plurality of basis functions scaled (weighted) by their corresponding coefficients produces a close approximation of the corresponding portion of the original source data. FDCT 104 generally produces a number of such sequences of coefficients each corresponding two a portion of the input source data 102.

The coefficients generated by FDCT 104 are then quantized or scaled by quantizer 106 in accordance with quantization values 116. The JPEG specification as well as other specifications suggests a default set of quantization values to be used for scaling the coefficients generated by the FDCT 104 based on typical human viewing of images. The purpose of quantization is to achieve further compression by representing the DCT coefficients with no greater precision than is necessary to achieve the desired degree of image reproduction fidelity. The quantization values therefore represent a level of noise inherent in the underlying source image that may be eliminated by scaling each of the coefficients. In effect, quantization normalizes the set of coefficients to an accepted baseline for the reproduction of the compressed image based on presumptions regarding a level of noise inherent in the source image that need not be reproduced.

The quantized coefficients in a typical DCT-based encoding application are represented as intermediate symbols initially compressed as a run of zero valued coefficients followed by a non-zero coefficient. This intermediate encoding is often referred to as "run length" encoding. The non-zero coefficient value is represented by a string of bits of a specified size. Typical coefficient values are represented as values of up to 11 bits resolution in JPEG DCT-based encoding/decoding. These intermediate values provide significant compression of the source data and may then be further compressed by entropy encoding.

Entropy encoder 108 then receives the quantized sequence of coefficients (e.g., the intermediate encoded values) from quantizer 106 and performs entropy encoding using the entropy encoding values 118. Entropy encoding provides a further compression of the quantized coefficient values by encoding each value as a corresponding symbol represented as an optimal number of bits. In general, entropy encoding may utilize well-known Huffman encoding techniques, arithmetic encoding techniques, or other similar entropy encoding techniques to encode the quantized coefficients into corresponding compressed symbols.

The compressed (encoded) data 110 is therefore the result of the sequence of entropy encoded quantized coefficients representative of the original input source of data 102. In addition, in accordance with JPEG and other image data exchange formats, the quantization values 116 and entropy encoding values 118 used for the particular data compression are stored or transmitted with the resulting compressed image data for use within a corresponding decoder.

DCT-based decoder 150 performs the inverse operations of DCT-based encoder 100. Encoded data 152 is received as input to the decoder 150. Entropy encoding values 164 and quantization values 166 utilized in the original encoding of the compressed data 152 are extracted from the compressed data exchange format to guide operations of entropy decoder 154 and quantizer 156. Entropy decoder 154 then decodes the sequence of symbols to recover the quantized coefficients encoded as run length symbols. The quantized coefficients are then received by the quantizer 156 and scaled by corresponding quantization values to approximate the original sequence of coefficients (minus a degree of noise level signals removed by the quantization process of the encoder). Lastly, IDCT 158 performs the inverse transformation of the weighted basis functions using the restored coefficients to generate reconstructed image data 160. Reconstructed image data 160 therefore represents a close approximation of the original encoded image source data 102.

As noted above, DCT-based encoding is inherently lossy in that the transformation of digital image data to a frequency domain performed by the DCT computations is inherently an approximation and further, the quantization and de-quantization elements may remove a degree of accuracy (e.g., increase lossiness) by scaling the resulting coefficients to remove unnecessary noise level signals. As noted above, although the process is inherently lossy, DCT computations (both forward and inverse) may none the less impose a significant computational burden on the device incorporating the encoder or decoder. Further, entropy encoding and decoding generates yet another inherent computational burden on the device implementing either the encoder features or the decoder features of a DCT-based image compression system.

Though FIG. 1 depicts a typical DCT-base encoding and decoding system as used in JPEG image compression, those of ordinary skill in the art will recognize similar structures used in other image encoding standards such as JPEG 2000 and MPEG though they may utilize other forms of domain transform computation. Still further, data encoding and decoding applications other than image data encode/decode may benefit from application of features and aspects hereof. FIG. 1 is therefore intended merely to represent an exemplary encoding/decoding system as presently practiced in the art which may benefit from application of features and aspects hereof.

Figure 2:
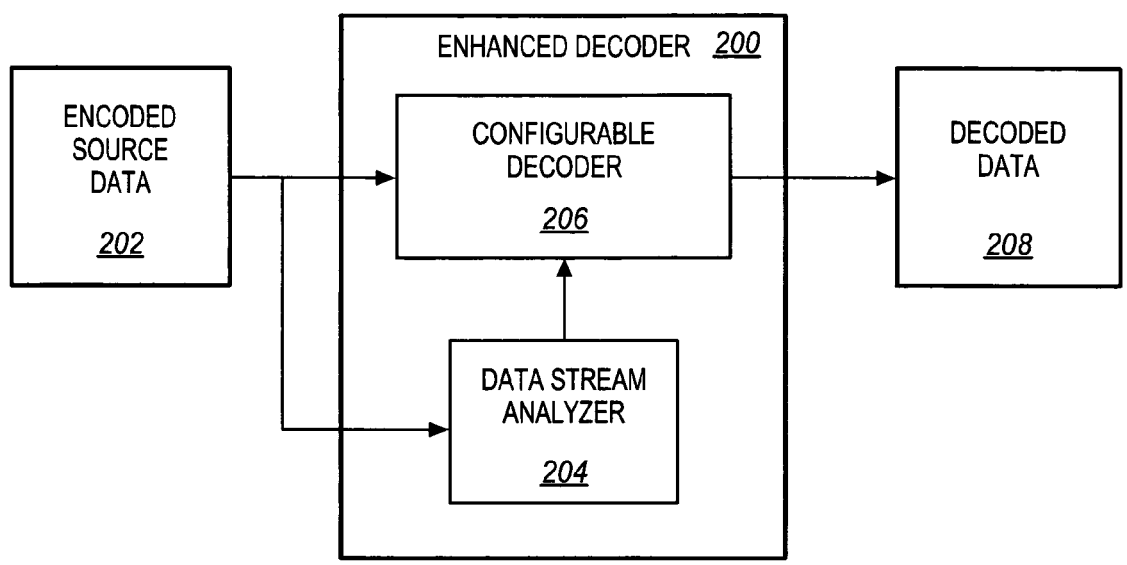
FIG. 2 is a block diagram broadly depicting an exemplary, enhanced decoder having a configurable decoding element in accordance with features and aspects hereof.

FIG. 2 is a block diagram broadly representing an enhanced decoder function 200 in accordance with features and aspects hereof. In general, the enhanced decoder 200 receives encoded source data 202 and decodes (decompresses) the source data 202 to generate decoded data 208. Within enhanced decoder 200, a data stream analyzer 204 analyzes aspects of the encoded source data and is operable to reconfigure the configurable decoder 206 to more quickly decode the encoded source data 202 in response to the analysis. As discussed further herein below, the enhanced decoder 200 may include a configurable entropy decoder capable of being reconfigured to optimize entropy decoding of entropy encoded coefficient values in a DCT-based system. The enhanced entropy decoder may include enhancements for Huffman symbol decode, for arithmetic decoding, for decoding of intermediate run-length encoded coefficients, etc. In addition, enhanced encoder decoder 200 may include a configurable IDCT computation element capable of being reconfigured to further optimize IDCT computations where additional loss of fidelity in reproduction of the original data is permissible. The improved entropy decoding and/or improved IDCT computation provides for improved decoding of DCT-based encoded data. In particular, the combination of both the improved entropy decoding and the improved IDCT computational performance may provide significant improvement of performance in decoding DCT-based encoded information such as image data.

In particular, features and aspects hereof allow for reconfiguration of the DCT-based decoding features to improve underlying computational speed and hence decoding or decompression speed. Further, where the decoding features and aspects hereof are implemented as suitably programmed instructions in a general or special purpose processor that has caching features for executable instructions and data, features and aspects hereof may help reduce the size of the software modules. Smaller size of a code module may help assure that the decoding instructions and associated control data may fit in the cache memory associated with the processor to further enhance speed of decoding of the received data.

Though FIG. 2 and other figures described herein below present features and aspects hereof based on DCT/IDCT computations as a domain transform, other domain transforms may be similarly applied. For example, JPEG 2000 utilizes wavelet computations to transform image data into frequency domain information. These other transformations may be similarly applied in conjunction with features and aspects hereof within the intended scope of this patent.

Figure 3:
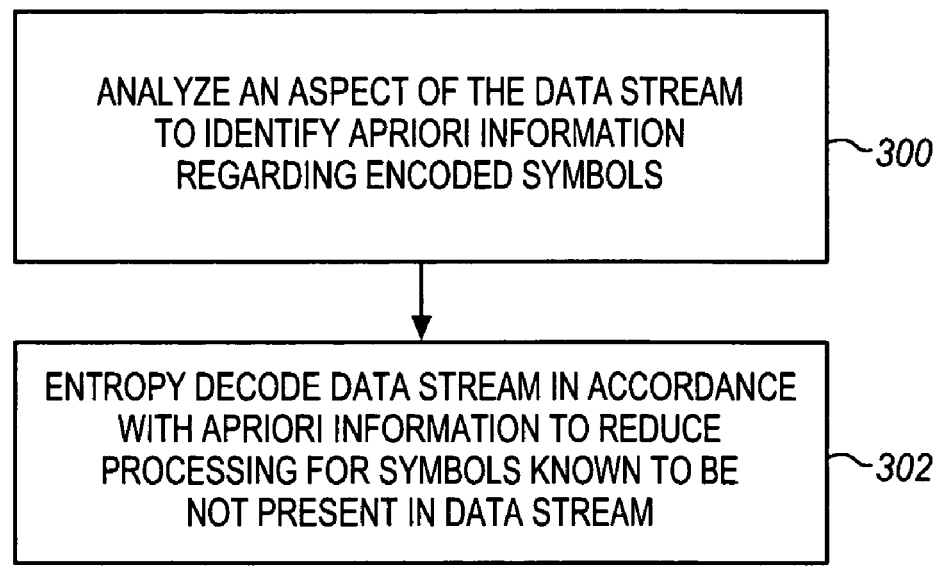
FIGS. 3 and 4 are flowcharts broadly describing exemplary methods in accordance with features and aspects hereof to configure an enhanced entropy decoder and an enhanced IDCT computation element, respectively, to improve performance.
Figure 4:
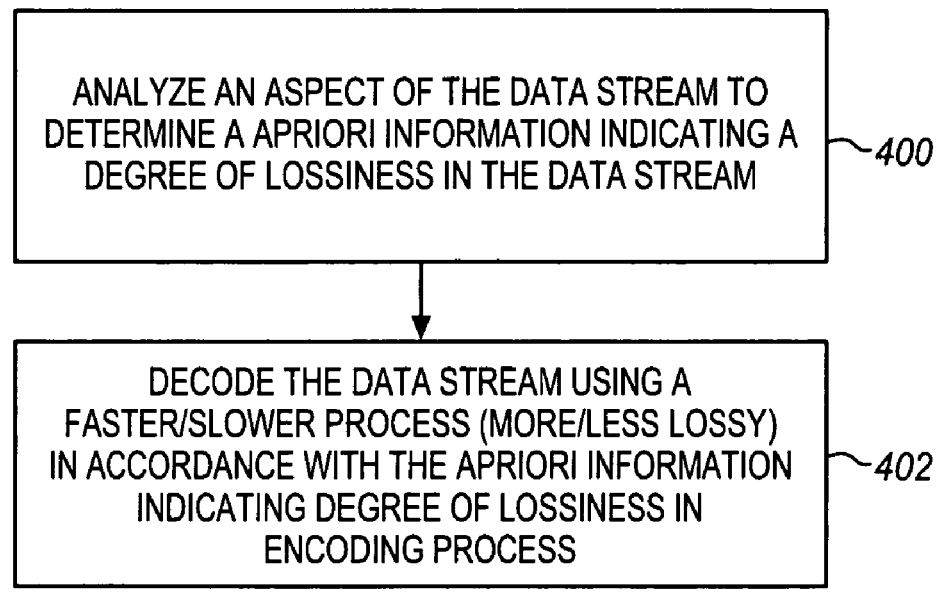

FIGS. 3 and 4 are flowcharts broadly describing methods associated with features and aspects hereof to enhance performance of decoding of DCT encoded data. FIG. 3 is a flow chart representative of a method in accordance with features and aspects hereof to improve performance of entropy decoding of a DCT encoded source data stream. Element of 300 is first operable to analyze an aspect of the encoded data stream to identify apriori information regarding the encoded symbols. Element 302 is then operable to perform entropy decoding and/or run length decoding of the input data stream in accordance with the apriori information derived by operation of element 300. In particular, the apriori information may identify symbols that may be present in the entropy encoded data stream and, more specifically, symbols that cannot be present in the entropy encoded data stream. For example, as discussed further herein below, the quantization values in a quantization table of a DCT encoded file may be analyzed to determine that all entropy encoded values must fall within a specific range of values less than the nominal range of values that may be encoded by the entropy encoding. Thus, processing of element 302 may be optimized by eliminating any processing associated with symbols that cannot be present in the DCT encoded data stream. Such an optimization may be applied to entropy encoding such as Huffman or arithmetic encoding to reduce processing time therefore as well as to run length decoding where, for example, logic may be optimized for fetching input bits based on apriori knowledge of the maximum symbol size (e.g., the maximum size in bits of any DCT coefficient based on apriori information derived from the quantization table).

FIG. 4 is a flowchart describing broadly describing a method in accordance with features and aspects hereof to enhance performance of IDCT computations for decoding a DCT encoded data stream. Element 400 is first operable to analyze the data stream to identify apriori information indicating an acceptable degree of loss in the encoded data stream. The degree of loss that is acceptable in the data stream may be determined, for example, by analysis of quantization values in the quantization table of the DCT encoded data stream. Element 402 is operable to decode the data stream using a faster (more lossy) inverse DCT process in accordance with the apriori information an acceptable degree of lossiness in the encoding process. For example, in the case of an IDCT computation, more or less accurate approximations may be used in the requisite computations in accordance with the degree of lossiness determined to be acceptable by processing of element 400. Where quantization values indicate that lower resolution (e.g., faster) arithmetic may be utilized while still producing an acceptable approximate reconstruction of the original data, faster integer approximations of the underlying real number arithmetic may be utilized thus improving performance of IDCT computations in the image decode processing.

Figure 5:
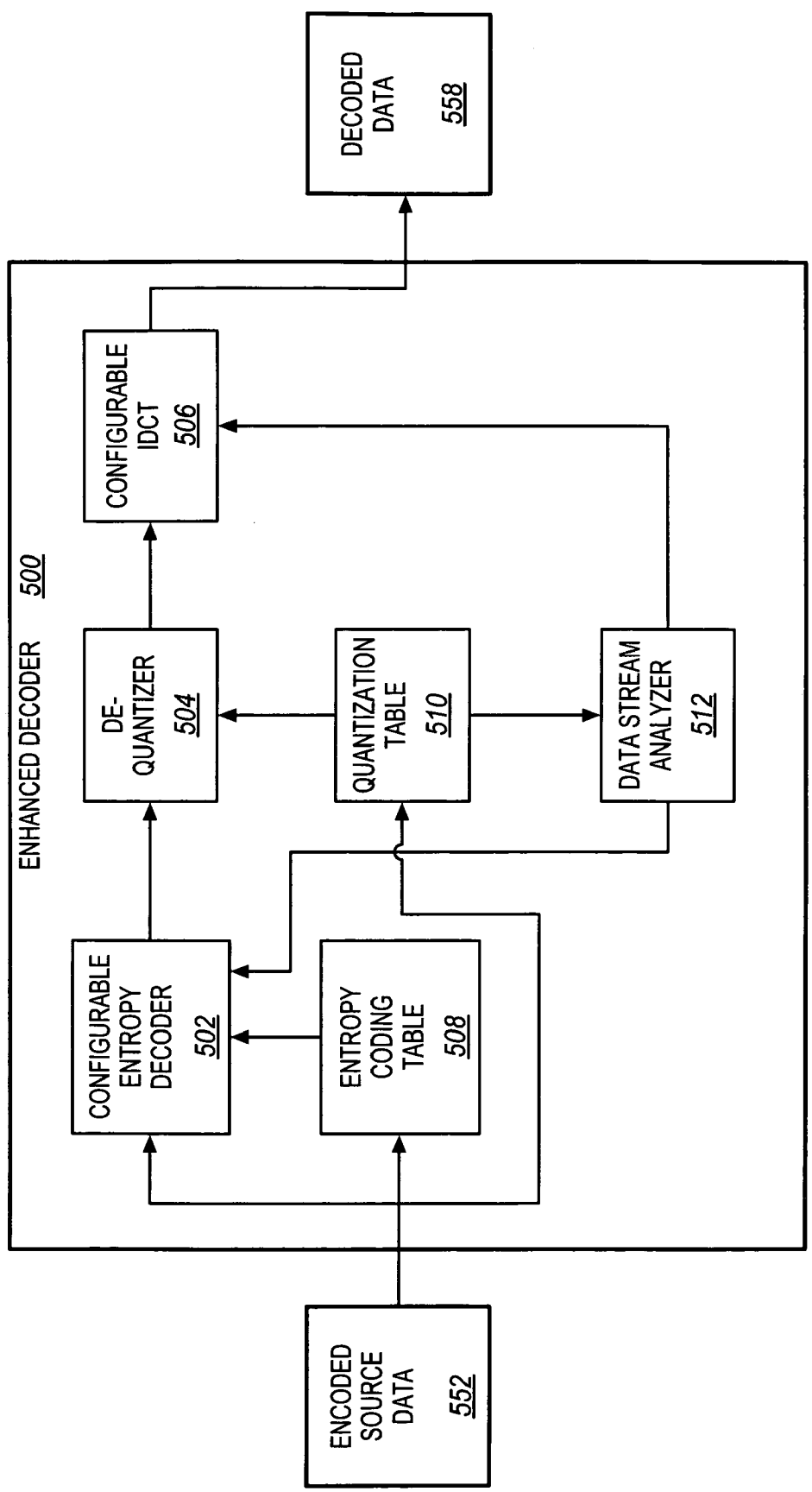
FIG. 5 is a block diagram providing more details of an exemplary DCT decoder enhanced in accordance with features and aspects hereof to improve performance of entropy decoding, IDCT computations, or both.

FIG. 5 is a block diagram of a decoder 500 enhanced in accordance with features and aspects hereof and particularly useful in DCT-based decoding. Enhanced decoder 500 receives DCT encoded source data 552 and decodes the information to produce decoded data 558. As previously noted and as known in the art, DCT-based encoded data 552 is first encoded by a forward DCT ("FDCT") transformation computation, then quantized to scale the coefficients of the FDCT computation, then entropy encoded to further compress encoding of the quantized coefficients. Enhanced decoder 500 therefore performs an inverse sequence of steps first entropy decoding (decoder 504) the entropy encoded signals symbols, then de-quantizing (de-quantizer 504) coefficients resulting from the entropy decoding, then performing IDCT computations on the de-quantized coefficients to generate the decoded data 558.

In general, a configurable entropy decoder 502 within enhanced decoder 500 performs entropy decoding of the received source data 552 in accordance with apriori information to generate a sequence of decoded symbols that are run length encoded, quantized coefficients. The run length encoded symbols are fetched from the decoded data stream with optimized logic as determined in accordance with the apriori information. The decoded coefficients are then de-quantized by de-quantizer 504 to generate de-quantized coefficients. Configurable IDCT then receives the de-quantized coefficients and performs appropriate computations to transform the coefficients and underlying basis functions back into the original digital data 558 also optimized in accordance with apriori information.

In accordance with features and aspects hereof, enhanced decoder 500 may include a configurable entropy decoder 502 and a configurable IDCT computation element 506. Configurable entropy decoder 502 and configurable IDCT 506 may be configured in response to data stream analyzer 512. In particular, with respect to entropy decoding, entropy coding table 508 represents the entropy encoding control values stored in encoded source data 552 and extracted for use by configurable entropy decoder 502. Quantization table 510 similarly stores the quantization values extracted from encoded source data 552 representing the quantization values used in the corresponding encoding process. Data stream analyzer 512 may then analyze the quantization table values 510 to determine from the quantization values therein symbols that cannot be present in the entropy encoded symbols of source data 552. By so determining entropy encoded values that cannot be present in the input stream, data stream analyzer 512 is operable to appropriately reconfigure entropy decoder 502 to improve performance thereof based upon this apriori information. In particular, for example, generalized processing of configurable entropy decoder 502 useful for general decode of any permissible symbol may be simplified by reconfiguration in response to data stream analyzer 512.

In addition, configurable entropy decoder 502 may be reconfigured in accordance with the apriori information derived from the quantization table 510 to optimize run length decoding of the coefficients from the entropy decoded stream of bits.

Reconfiguration may entail bypassing or otherwise eliminating processing associated with symbols that cannot be present in the sequence of encoded symbols in source data 552. In addition, reconfiguration may entail bypassing or eliminating logic associated with fetching the run length encoded coefficient values following entropy decoding. The quantization values may indicate, for example, that all values that have been entropy encoded in the source data 552 are within a smaller reduced range of values (e.g., lower than a specified maximum value as determined by a minimum quantization value in the quantization table 510). Thus the run length encoded size of non-zero coefficients may be known to be less than a certain number of bits in length. Fetching of a next coefficient value from the entropy decoded stream of bits may thus be optimized based on this apriori knowledge derived from the quantization values. Rather than test how many bytes of data need be fetched for a next run length encoded coefficient, the logic may be "hard wired" to fetch an appropriate number of bits based on the apriori information.

More specifically, for example, data stream analyzer 512 may reconfigure the configurable entropy decoder 502 by selecting among a plurality of alternative logic modules within the configurable entropy decoder. Each pre-configured logic module may be implemented to eliminate processing for an identified subset of potential entropy encoded symbols known not to be present in the received source data stream and/or to streamline fetching of run length encoded bits for a next coefficient symbol in the entropy decoded stream of bits.

In like manner, data stream analyzer 512 may reconfigure configurable IDCT 506 to utilize simplified arithmetic approximations for the IDCT computations in response to analysis of the quantization table 510. More specifically, for example, quantization values in the quantization table 510 may be analyzed to determine an acceptable level of lossiness or noise corresponding to an identified level of noise in the encoded symbols of the received data stream 552. Data stream analyzer 512 may also select among a plurality of predefined logic computation logic modules within configurable IDCT 506 to select faster, simplified arithmetic approximation to improve the performance of the IDCT computation element 506. Where a higher degree of lossiness is acceptable in view of detected noise signals in the received data stream as indicated by the quantization values, faster, lower precision integer approximations may be utilized to improve the computational performance of configurable IDCT 506. Conversely, where a lower degree of lossiness is indicated because of a lower degree of noise present in the encoded symbols as indicated by the quantization values, higher precision integer approximation or even floating point approximation of the underlying real number arithmetic may be utilized to improve the accuracy of computation to the detriment of the performance of configurable IDCT 506.

For example, the well known "AAN" techniques (see, Y. Arai, T. Agui, and M. Nakajima: *A Fast DCT-SQ Scheme for Images*, Trans. of IEICE, Vol. E.71, No. 11, pp. 1095–1097, 1988) requires 5 multiplication operations. These multiplications can be approximated via shift and add operations in a simple, fast circuit to improve speed of the computation. The number of adds required in such shift/add approximations is governed by the required precision. For example, if the maximum relative multiplication error allowed is 0.0001, the five multiplications can be approximated by 14 adds. If on the other hand, the maximum relative error allowed is 0.0009, then 9 adds suffice in the shift/add approximations. Thus, the DCT/IDCT computations may be configured for more or less precision as required for an application.

Figure 7:
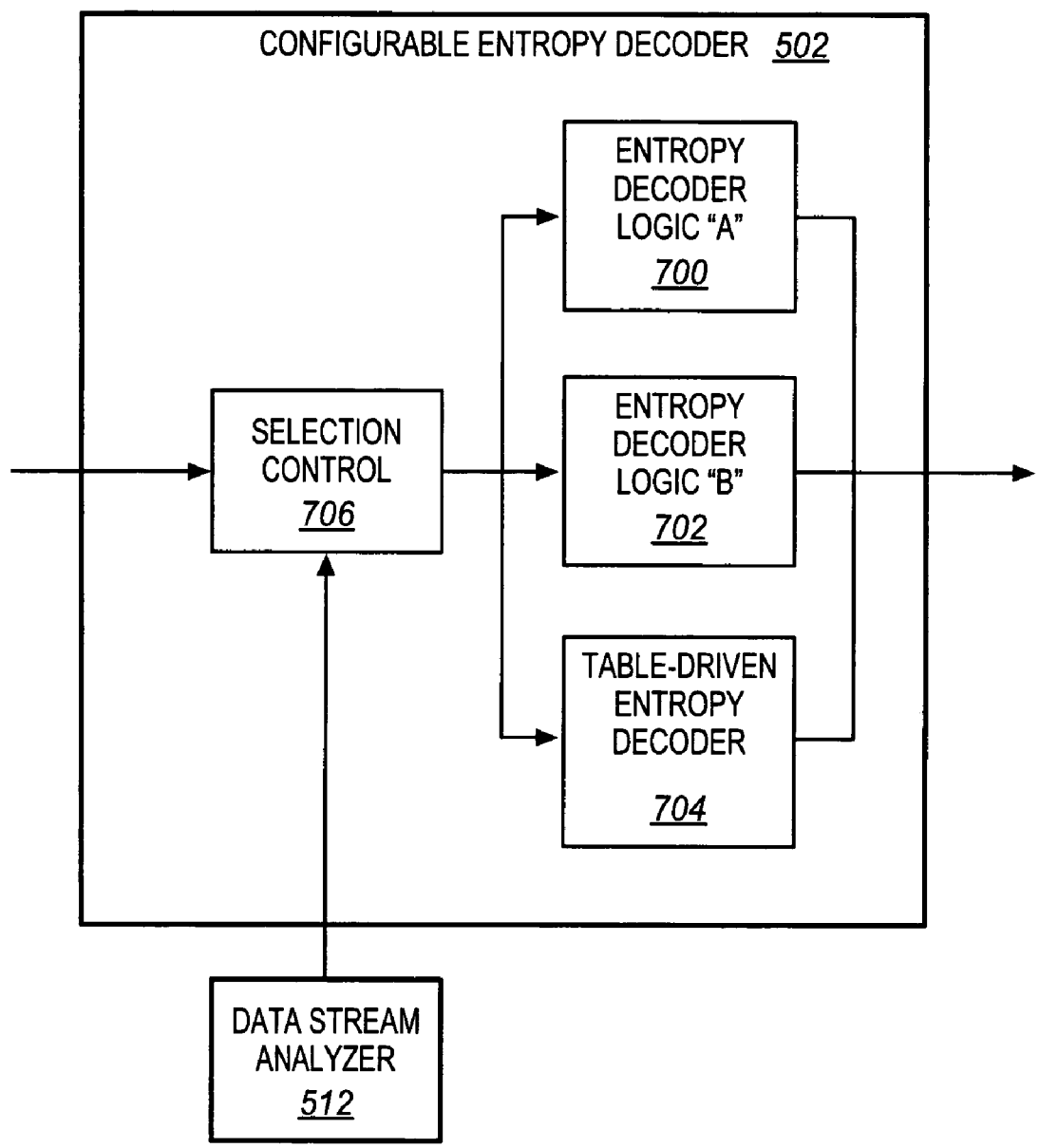
FIGS. 7 and 8 are block diagrams providing exemplary additional detail of an enhanced entropy decoder and an enhanced IDCT computation element, respectively, in accordance with features and aspects hereof to improve performance of entropy decoding, IDCT computations, or both.

FIG. 7 is a block diagram providing additional details of an exemplary configurable entropy decoder 502 as in FIG. 5. The data stream analyzer 512 is operable to apply an appropriate signal to selection control 706. Selection control 706 receives encoded symbols as input and routes them as input to one of multiple entropy decoder logic modules. Entropy decoder logic module "A" 700 and entropy decoder logic module "B" 702 provide computational and Boolean logic to perform entropy decoding for a particular subset of encoded symbols and to more rapidly fetch associated, resultant run length encoded coefficient symbols. For example, the logic module "A" 700 may represent entropy decoding logic capable of decoding all possible encoded symbols for a maximum size of non-zero coefficient value run length encoded symbols—i.e., the general case of entropy decoding processing capable of processing all possible values. By contrast, logic module "B" 702 may be optimized to decode only a defined subset of possible entropy encoded symbols and to fetch run length encoded coefficient symbols in accordance with other apriori information where a maximum coefficient symbol size is less than the theoretical maximum size processed by logic module "A" 700. For example, where data stream analyzer 512 determines that particular entropy encoded signals cannot be present in the encoded data stream and therefore that coefficient values cannot be larger than some predefined number of bits, logic module "B" 702 may be selected by control elements 706 under direction of data stream analyzer 512 so as to more rapidly decode the coefficient symbols. Thus, logic module "B" 702 may be devoid of processing logic for some symbols that may be processed by logic module "A" 700 but those streams may be processed more rapidly by module "B" because the added processing logic need not be present as indicated by the apriori information.

In particular, where a maximum coefficient symbol size for the received symbols is particularly small, a further logic module may be implemented to decode the symbols using a simple table look up rather than computational and Boolean logic. Where the size is too large, such a lookup table may be impractical to implement. Where the maximum size of symbols actually present in the received data stream is small enough, a look up table may be a practical embodiment and may thus be selected by control elements 706 at the direction of the stream analyzer 512.

Figure 8:
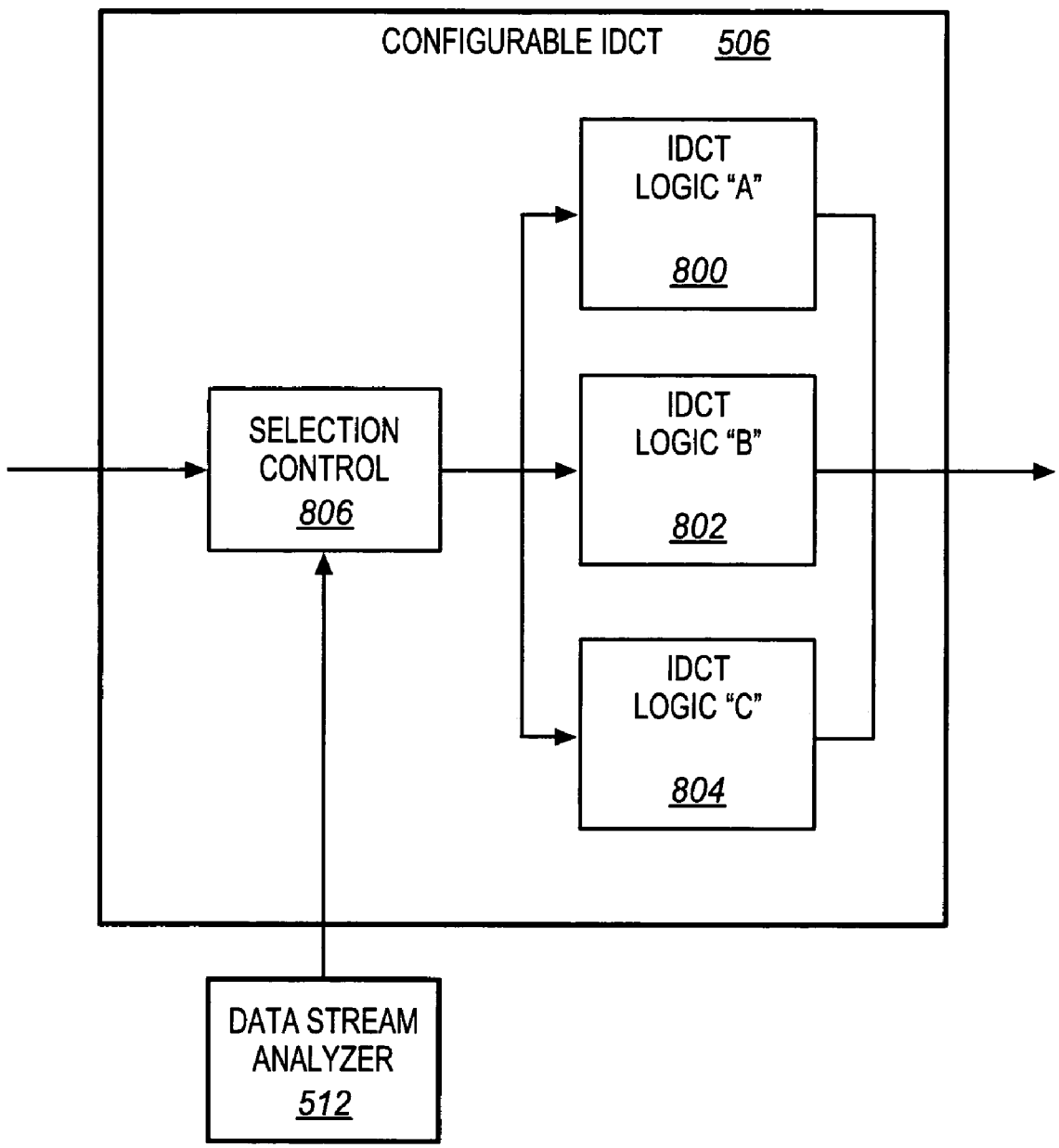

FIG. 8 is a block diagram providing additional details of an exemplary configurable IDCT computation element 506 as shown in FIG. 5. Data stream analyzer 512 may determine that a particular level of lossiness is acceptable in the IDCT computation based on a detected level of noise in the received data stream as indicated by quantization values in the quantization table. Data stream analyzer 512 may then apply an appropriate selection signal to selection control element 806 to select one of a plurality of computational modules 800, 802, and 804 for performing the desired IDCT computation. Where a lower level of lossiness may be acceptable, IDCT logic module "A" 800 may be selected as a preferred computation module to provide a highest level of accuracy and fidelity of reproduction in the IDCT computations. Where lesser degrees of accuracy are required as indicated by the degree of noise in the received data stream, alternate modules "B" 802 and "C" 804 may be selected by selection control element 806 under direction of data stream analyzer 512.

Figure 6:
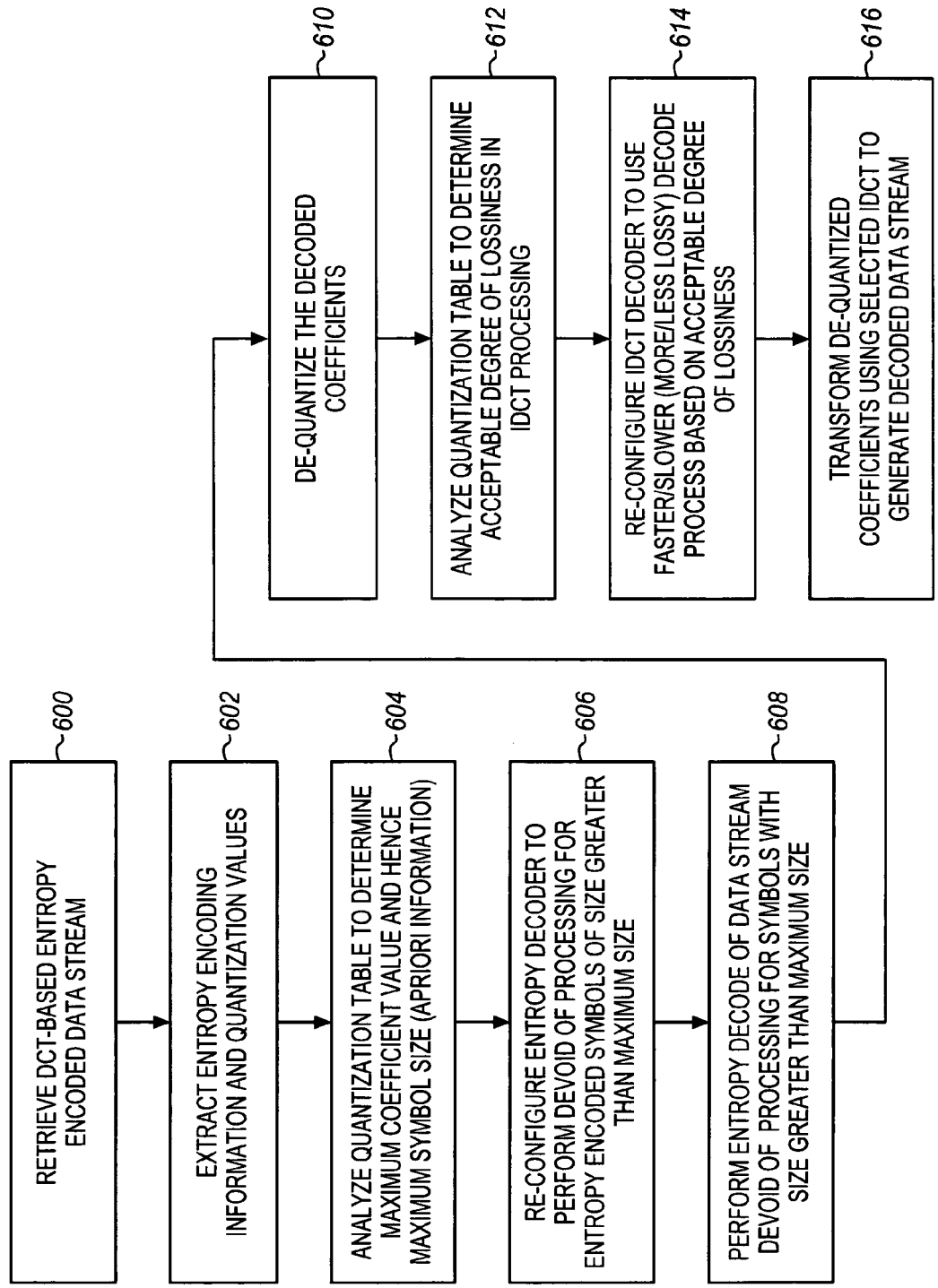
FIG. 6 is a flowchart providing more details of an exemplary DCT-base decoding method in accordance with features and aspects hereof to improve performance of entropy decoding, IDCT computations, or both.

FIG. 6 is a flowchart describing operation of an enhanced decoder in accordance with features and aspects hereof. Element 600 is first operable to retrieve the DCT-based, entropy encoded data stream. The data stream may be provided by any suitable source including, for example, receiving the data stream from a transmitting device, or retrieving the data stream from a storage device on which the data stream was previously encoded and stored. Processing of element 600 therefore represents retrieval of the DCT-based encoded data stream from any suitable source. Element 602 is next operable to extract entropy encoding information and quantization information to be stored in appropriate tables for operation of the enhanced DCT-based decoder. For example, as applied to digital image decoding, the quantization table and entropy encoding information is stored as a predefined header portion of the retrieved source image.

Element 604 is then operable to analyze data stream to determine apriori information useful for enhancing performance of the enhanced decoder. More specifically, for example, the method may analyze the quantization values in the quantization table to determine the maximum coefficient value that was encoded by an entropy encoder and hence to determine a maximum run length encoded size for any symbol that may be present in the retrieved data stream. Still more specifically, for example, in accordance with JPEG image encoding standards, coefficient values may be as large as eleven bits. However, common quantization values in the quantization table may indicate that no coefficient after quantization (and prior to entropy encoding) had a value greater than may be represented in eight bits because of the quantization scaling performed in accordance with the quantization values. Thus, no entropy encoded coefficient could have a value greater than for example eight bits. Thus, a maximum coefficient symbol size may be determined from this maximum coefficient value such that it may be known in advance of entropy decoding (e.g., apriori information) that no coefficient symbol has a size greater than eight bits.

Armed with this apriori information determined by element 604, the method next continues with element 606 to reconfigure the configurable entropy decoder of the enhanced decoder to perform its decode processing devoid of any processing for symbols having size greater than the determined maximum size. As noted above, such a reconfiguration may entail selecting among a plurality of pre-defined processing and logic modules to select a logic module devoid of processing for symbols known to be not present in the encoded data stream. Where the entropy decoding logic models are implemented as programmed instructions (e.g., software modules), an appropriate software module may be selected by dynamically loading the module or otherwise configuring that the program code module to execute only the preferred, optimized software module. Where the various logic modules of such an enhanced, configurable entropy decoder are implemented as custom circuits, appropriate multiplexing circuits well known to those of ordinary skill in the art may be utilized to select a preferred logic module.

Element 608 then represents processing to perform the entropy decoding of the data stream devoid of processing for encoded coefficients having a symbol size greater than the identified maximum symbol size. In other words, the entropy decoding is performed in a manner optimized in accordance with the apriori information identified by operation of element 604. Element 610 represents processing to de-quantize the quantized coefficients now decoded from the entropy encoded data stream.

Element 612 is then operable to analyze the quantization table to determine an acceptable degree of lossiness in the forward DCT encoding process such that the inverse DCT computation may be optimized in recognition of the noise level inherently present in the encoded coefficients. As above, the quantization table values may be analyzed to identify a level of noise signals present in the DCT encoded coefficients and hence a further level of lossiness that may be acceptable in view of the inherent degree of noise present in the encoded information.

Element 614 is operable to reconfigure the configurable IDCT computational element of the enhanced decoder to use faster approximation arithmetic techniques in response to identifying a higher degree of lossiness that may be acceptable. In other words, the IDCT computational element is reconfigured to utilize faster or slower approximation arithmetic in response to the apriori information gathered by operation of element 612. As noted above, floating point arithmetic within an IDCT computation element provides less lossiness in its approximation of real number arithmetic. By contrast, integer arithmetic approximations including, for example, shifting and adding bits of integer values to approximate multiplication provides other levels of computational approximations with varying degrees of accuracy depending on the number of bits of precision utilized in the integer arithmetic. Thus, reconfiguration of the IDCT computational element may similarly entail selection of one of a plurality of computational modules in accordance with the nose indicated by the quantization apriori information.

Element 616 is operable to perform the selected transformation computation on the de-quantized data stream using the selected IDCT computation element to generate the decoded data stream. In other words, element 616 is operable new reconstruct an approximation of the original data with a degree of lossiness as dynamically determined and configured by operation of elements 612 and 614.

Figure 9:
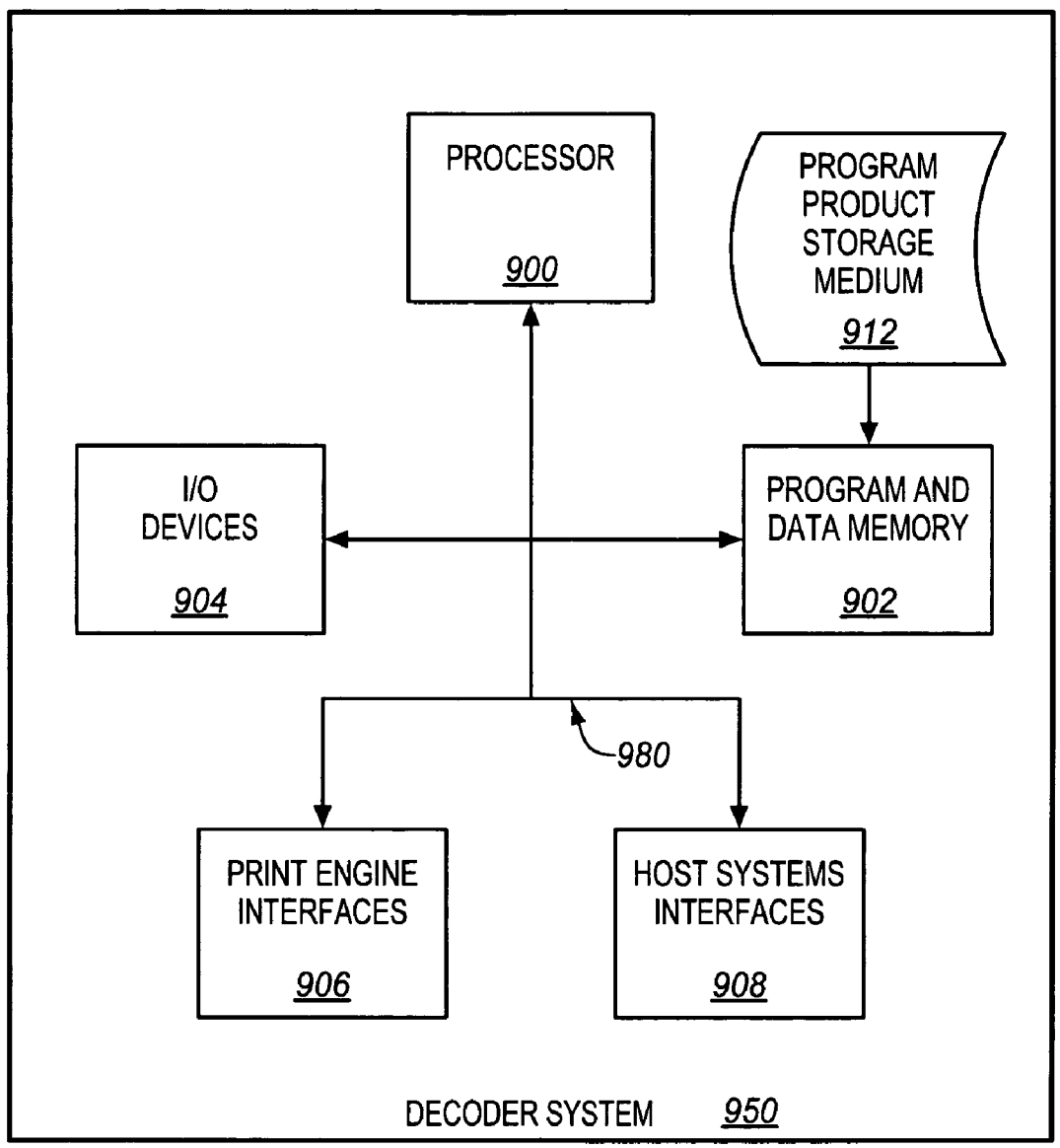
FIG. 9 is a block diagram of an exemplary system in which a computer readable medium may embody features and aspects hereof.

Embodiments of the invention can take the form of an entirely hardware embodiment, an entirely software embodiment or an embodiment containing both hardware and software elements. In a preferred embodiment, the invention is implemented in software, which includes but is not limited to firmware, resident software, microcode, etc. FIG. 9 is a block diagram depicting a decoder system 950 as including a data processing device (CPU 900 and Memory 902) adapted to provide features and aspects hereof by executing programmed instructions and accessing data stored on a computer readable storage medium 912.

Furthermore, the invention can take the form of a computer program product accessible from a computer-usable or computer-readable medium 912 providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor 900 coupled directly or indirectly to memory elements 902 through a system bus 980. The memory elements can include local memory employed during actual execution of the program code, bulk storage, and cache memories which provide temporary storage of at least some program code in order to reduce the number of times code must be retrieved from bulk storage during execution.

Input/output or I/O devices 904 (including but not limited to keyboards, displays, pointing devices, etc.) can be coupled to the system either directly or through intervening I/O controllers. One particular I/O device useful in a data processing system adapted as a printer controller is a print engine interface 906 for coupling the decoder system 950 to the signals and protocols of the print engines adapted for marking pixels on paper.

Network adapters or other host system interfaces 908 may also be coupled to the system to enable the data processing system to become coupled to other data processing systems or storage devices through intervening private or public networks. Modems, cable modems, IBM Channel attachments, SCSI, Fibre Channel, and Ethernet cards are just a few of the currently available types of network or host interface adapters.

Although specific embodiments were described herein, the scope of the invention is not limited to those specific embodiments. The scope of the invention is defined by the following claims and any equivalents thereof.

I claim:

1. A method for decoding a data stream having an entropy encoded sequence of encoded symbols, the method comprising:

analyzing an aspect of the data stream to determine apriori information indicative of symbols not present in the compressed data stream; and entropy decoding the data stream in accordance with the apriori information by processing a portion of symbols present in the data stream devoid of processing for symbols not present in the data stream as indicated by the apriori information.

2. The method of claim 1 wherein the data stream comprises a compressed data stream that is generated using a discrete cosine transformation ("DCT") to generate a sequence of coefficients quantized in accordance with a corresponding quantization table and wherein the generated sequence of coefficients is compressed using entropy encoding of the coefficients to generate encoded coefficients, wherein the step of analyzing further comprises determining the apriori information as a maximum symbol size for the encoded coefficients from the quantization table, and wherein the step of entropy decoding further comprises configuring the entropy decoder to operate devoid of processing for any symbols having a symbol size greater than the maximum symbol size.

3. The method of claim 2 wherein the compressed data stream is encoded in compliance with JPEG DCT-based encoding, and wherein the step of determining a maximum symbol size further comprises:

determining a minimum quantization value in the quantization table; and determining the maximum symbol size based on the minimum quantization value.

4. The method of claim 3 wherein any coefficient may be encoded by entropy encoding as a symbol of N bits, wherein the step of determining the maximum symbol size further comprises determining that at least M of the N bits are not needed to entropy decode each coefficient, and wherein the step of entropy decoding further comprises performing the entropy decoding devoid of any processing for symbols having a size greater than N−M bits.

5. The method of claim 4 wherein N is 11 and M is 3, and wherein the step of entropy decoding further comprises performing the entropy decoding devoid of any processing for symbols having a size greater than 8 bits.

6. The method of claim 1 wherein the step of entropy decoding further comprises:

using a lookup table to decode the encoded symbols where the lookup table has entries for each encoded symbol in the data stream and is devoid of entries for symbols not present in the data stream as indicated by the apriori information.

7. A method for decoding a data stream comprising:

analyzing an aspect of the data stream to determine apriori information indicative of an acceptable degree of lossiness in the data stream; and decoding the data stream in accordance with the apriori information by processing a portion of the data stream using mathematical approximations with a higher degree of lossiness as indicated by the apriori information.

8. The method of claim 7 wherein the data stream comprises discrete cosine transform ("DCT") coefficients, and decoding the data stream in accordance with the apriori information by processing a portion of the coefficients using inverse DCT ("IDCT") approximations with a higher degree of lossiness as indicated by the apriori information.

9. The method of claim 8 wherein the data stream further includes quantization values used to scale the coefficients prior to having been DCT encoded, wherein the step of analyzing further comprises determining the apriori information as a minimum quantization value for the encoded coefficients, and wherein the step of decoding further comprises using IDCT approximations with higher degree of lossiness in proportion to larger values of the minimum quantization value.

10. The method of claim 9 wherein the step of decoding further comprises:
providing a plurality of IDCT decoding modules of varying degrees of lossiness corresponding to use of varying computational approximations;
selecting a preferred IDCT decoding module from the plurality of IDCT decoding modules in accordance with the minimum quantization value; and
performing the preferred IDCT decoding module to decode the sequence of coefficients.

11. A decoder for decoding an entropy encoded data stream, the decoder comprising:
a data stream analyzer adapted to analyze information received in the data stream to determine apriori information indicating symbols not contained in the data stream; and
an entropy decoder coupled to receive the apriori information and adapted to decode a sequence of entropy encoded symbols in the data stream in accordance with the apriori information to decode a portion of the symbols devoid of processing for entropy encoded symbols not present in the data stream as determined from the apriori information.

12. The decoder of claim 11 wherein the data stream comprises a compressed data stream that is generated using a discrete cosine transformation ("DCT") to generate a sequence of coefficients in accordance with a corresponding quantization table and wherein the sequence of coefficients is compressed using entropy encoding of the coefficients to generate encoded coefficients,
wherein the data analyzer is further adapted to determine the apriori information as a maximum symbol size for the encoded coefficients from the quantization table, and
wherein the entropy decoder is configurable responsive to the data analyzer to operate devoid of processing for any symbols having a symbol size greater than the maximum symbol size.

13. The decoder of claim 12
wherein the compressed data stream is encoded in compliance with JPEG DCT-based encoding, and
wherein the data analyzer is further adapted to determine a minimum quantization value in the quantization table and is further adapted to determine the maximum symbol size based on the minimum quantization value.

14. The decoder of claim 13
wherein any coefficient may be encoded by entropy encoding as a symbol of N bits,
wherein the data analyzer is further adapted to determine that at least M of the N bits are not needed to entropy decode each coefficient, and
wherein the entropy decoder is further configurable responsive to the data analyzer to decode symbols devoid of any processing for symbols having a size greater than N−M bits.

15. The decoder of claim 14
wherein N is 11 and M is 3, and
wherein the entropy decoder is further configurable responsive to the data analyzer to decode symbols devoid of any processing for symbols having a size greater than 8 bits.

16. The decoder of claim 11 wherein the step of entropy decoder further comprises:
a lookup table used to decode the encoded symbols where the lookup table has entries for each encoded symbol in the data stream and is devoid of entries for symbols not present in the data stream as indicated by the apriori information.

17. A decoder for decoding a data stream, the decoder comprising:
a data analyzer adapted to analyze an aspect of the data stream to determine apriori information indicative of an acceptable degree of lossiness of the data stream; and
a decoder configurable to decode the data stream in accordance with the apriori information by processing a portion of the data stream using arithmetic approximations with a higher degree of lossiness as indicated by the apriori information.

18. The decoder of claim 17
wherein the data stream is a discrete cosine transform ("DCT") encoded data stream having a sequence of coefficients, and
wherein the decoder is further configurable to decode the data stream in accordance with the apriori information by processing a portion of the coefficients using inverse DCT ("IDCT") approximations with a higher degree of lossiness as indicated by the apriori information.

19. The decoder of claim 18
wherein the data stream further includes quantization values used to scale the coefficients prior to having been DCT encoded,
wherein the data analyzer is further adapted to determine the apriori information as a minimum quantization value for the encoded coefficients, and
wherein the decoder is further configurable to decode using IDCT approximations with higher degree of lossiness in proportion to larger values of the minimum quantization value.

20. The decoder of claim 19 wherein the decoder further comprises:
a plurality of IDCT decoding modules of varying degrees of lossiness corresponding to use of varying computational approximations, wherein a preferred IDCT decoding module is selected from the plurality of IDCT decoding modules by configuring the decoder in accordance with the minimum quantization value, and wherein the preferred IDCT decoding module is operable to decode the sequence of coefficients using IDCT computational approximations with a degree of lossiness in proportion to the value of the minimum quantization value.

\* \* \* \* \*